(12) United States Patent
Mazumdar et al.

(10) Patent No.: US 10,627,269 B2
(45) Date of Patent: Apr. 21, 2020

(54) SYSTEM AND METHOD FOR MEASURING FLUID PROPERTIES USING MAGNETIC FIELD TECHNIQUES VIA MAGNETIC TRACER

(71) Applicant: National Technology & Engineering Solutions of Sandia, LLC, Albuquerque, NM (US)

(72) Inventors: Yi Chen Mazumdar, Albuquerque, NM (US); Martin B. Nemer, Albuquerque, NM (US); Carlton F. Brooks, Albuquerque, NM (US); Bart G. van Bloemen Waanders, Albuquerque, NM (US); Christine Cardinal Roberts, Albuquerque, NM (US); Amanda B. Dodd, Fremont, CA (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 16 days.

(21) Appl. No.: 16/124,046

(22) Filed: Sep. 6, 2018

(65) Prior Publication Data
US 2020/0080876 A1 Mar. 12, 2020

(51) Int. Cl.
*G01F 1/58* (2006.01)
*G01K 7/36* (2006.01)
*G01R 33/34* (2006.01)
*G01R 33/12* (2006.01)
*G01L 9/14* (2006.01)

(52) U.S. Cl.
CPC ............... *G01F 1/582* (2013.01); *G01K 7/36* (2013.01); *G01L 9/14* (2013.01); *G01R 33/1276* (2013.01); *G01R 33/34061* (2013.01)

(58) Field of Classification Search
None
See application file for complete search history.

(56) References Cited

U.S. PATENT DOCUMENTS

| | | | |
|---|---|---|---|
| 2008/0204022 A1* | 8/2008 | Sillerud | B82Y 15/00 324/318 |
| 2018/0303375 A1* | 10/2018 | Gleich | G01N 27/745 |

OTHER PUBLICATIONS

Chen, Y. et al.,"Wireless Temperature Sensing Using Permanent Magnets for Multiple Points Undergoing Repeatable Motions", Proceedings of the ASME 2016 Dynamic Systems and Control Conference, DSCC2016, Oct. 12-14, 2016, Minneapolis, MN, USA, 10 pages.

(Continued)

*Primary Examiner* — Harshad R Patel
(74) *Attorney, Agent, or Firm* — Yee & Associates, P.C.

(57) ABSTRACT

A method and apparatus for determining a property of a fluid in a vessel. The method uses magnetic tracer particles and an externally applied magnetic field which orients the particles. When the fluid moves, it changes the orientation of the tracer particles, thus changing the magnetic fields. These changes are detected by external magnetic field sensors. By using mathematical models, the property of the fluid in the vessel is determined from the detected magnetic field. In this manner, fluid vorticity, velocity, strain and stress may be estimated.

20 Claims, 4 Drawing Sheets

(56) References Cited

OTHER PUBLICATIONS

Chen, Y. et al., "Remote Temperature Distribution Sensing Using Permanent Magnets", IEEE Transactions on Magnetics, vol. 53, No. 2 (2017), 13 pages.

Hori, T. and Sakakibara, J., "High-speed Scanning Stereoscopic PIV for 3D Vorticity Measurements in Liquids," Meas. Sci. Technol., vol. 15, No. 6 (2004), pp. 1067-1078.

* cited by examiner

SYSTEM AND METHOD FOR MEASURING FLUID PROPERTIES USING MAGNETIC FIELD TECHNIQUES VIA MAGNETIC TRACER

GOVERNMENT LICENSE RIGHTS

This invention was made with Government support under Contract No. DE-NA0003525 awarded by the United States Department of Energy/National Nuclear Security Administration. The U.S. Government has certain rights in the invention.

BACKGROUND INFORMATION

1. Field

The present disclosure relates generally to systems and methods for measuring fluid properties using magnetic field techniques via tracer particles. This includes techniques for measuring fluid properties such as vorticity, velocity, strain and stress. Additional properties such as motion, rotation, vibration, temperature, and electrical-current properties can also be measured. Illustrative embodiments allow measurements to be made through optically opaque environments at relatively high speeds. More particularly, illustrative embodiments are directed to a system and method for remotely and directly measuring these properties.

2. Background

Vorticity is a measure of local fluid rotation commonly utilized to understand and visualize flow structures from viscous to inviscid to turbulent flows. Vorticity may be used to understand circulation and lift, viscous stresses on a fluid volume, and boundary layer effects. With a clear understanding of boundary conditions, vorticity may be used to infer velocity profiles throughout a flow.

Conventional methods of measuring vorticity first measure velocity fields and then calculate vorticity indirectly. These methods include particle image velocimetry (PIV), magnetic resonance velocimetry, and X-ray PIV.

Methods previously developed for measuring vorticity directly use rotating-vane meters, torque sensors, laser Doppler shift, optical particle cluster tracking, and optical particle orientation tracking. Most of these methods, however, require an optically transparent access port or an optically transparent flow that may be transparent to any wavelengths including visible, infrared, ultraviolet, microwave, radar, and x-ray. Magnetic resonance and ultrasound techniques are inherently speed limited.

Therefore, it may be desirable to have a method and apparatus that take into account at least some of the issues discussed above, as well as other possible issues.

SUMMARY

Illustrative embodiments provide a method of determining a property of a fluid in a vessel. A detected magnetic field is measured from outside of the vessel. The detected magnetic field is generated by magnetic particles in the fluid. The property of the fluid in the vessel is determined from the detected magnetic field.

Illustrative embodiments also provide a method of determining a property of a fluid in a vessel. An applied magnetic field is applied to the fluid in the vessel from outside of the vessel to rotationally align magnetic dipole particles in the fluid. The applying of the applied magnetic field to the fluid in the vessel is stopped when the magnetic dipole particles in the fluid are rotationally aligned. After stopping applying the applied magnetic field, a magnetic field is detected outside of the vessel. The detected magnetic field is generated by the magnetic dipole particles in the fluid. The property of the fluid in the vessel is determined from the detected magnetic field. A graphical representation of the property of the fluid in the vessel is displayed.

Illustrative embodiments also provide an apparatus comprising a magnetic field generator, a magnetic field generator controller, a magnetic field sensor, a fluid flow calculator, and a display generator. The magnetic field generator controller is configured to control the magnetic field generator to apply an applied magnetic field to a fluid in a vessel from outside of the vessel to rotationally align magnetic dipole particles in the fluid and to stop applying the applied magnetic field to the fluid in the vessel when the magnetic dipole particles in the fluid are rotationally aligned. The magnetic field sensor is configured to detect a detected magnetic field outside of the vessel, wherein the detected magnetic field is generated by the magnetic dipole particles in the fluid after applying the applied magnetic field to the fluid in the vessel is stopped. The fluid flow calculator is configured to determine a flow of the fluid in the vessel from the detected magnetic field. The display generator is configured to generate a graphical representation of the flow of fluid in the vessel.

The features and functions may be achieved independently in various embodiments of the present disclosure or may be combined in yet other embodiments in which further details may be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that many applications, including many national-security applications, may have a need for flow, temperature, vibration and electrical-current diagnostics that can be applied to high-temperature high-pressure (HTHP) opaque vessels and materials. Examples include liquefaction of organic materials, porous-media flows, thermal decomposition of explosives, high-voltage breakdown, shock wave propagation, and heat-exchanger optimization. Quantitative measurements of these phenomena within sealed vessels under HTHP conditions are particularly challenging, as optical access is often infeasible. For assured safety, characterization and understanding of fluid temperature, vibration, and electrical behavior under HTHP conditions is desired.

Illustrative embodiments provide for determining characteristics of liquid flow in opaque vessels using magnetic-field diagnostics. In accordance with an example illustrative embodiment, the fluid may be seeded with magnetic particles, a time-varying field is applied to rotationally induce dipole alignment within well-defined regions, and then the flow-induced particle-driven magnetic time-varying field outside the vessel is observed using magnetometers. The magnetic field observations are inverted to provide a three-dimensional, time varying image of fluid motions.

Figure 1:
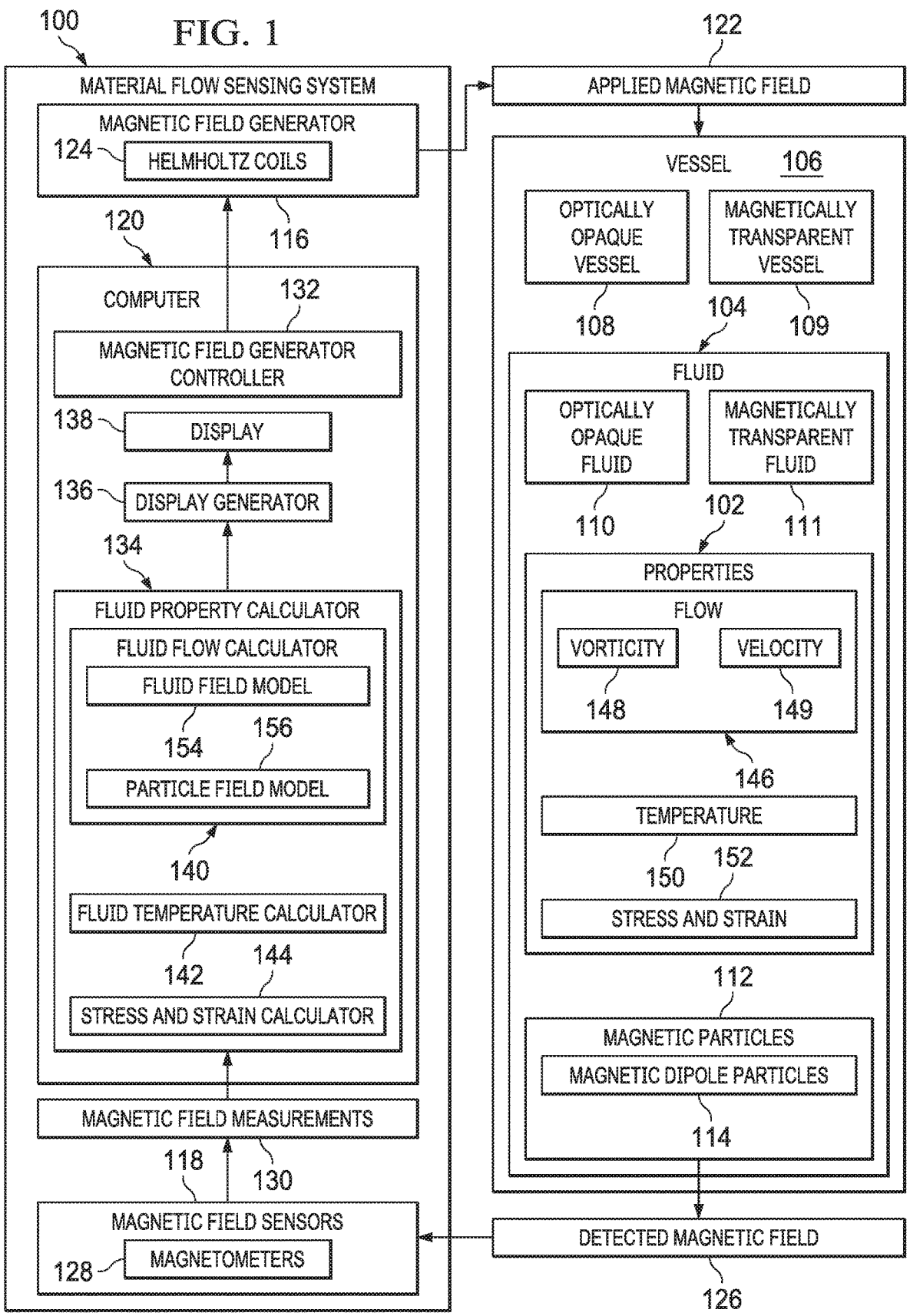
FIG. 1 is an illustration of a block diagram of a material flow sensing system for determining properties of a fluid in a vessel in accordance with an illustrative embodiment.

Turning to FIG. 1, an illustration of a block diagram of a material flow sensing system for determining properties of a fluid in a vessel is depicted in accordance with an illustrative embodiment. Material flow sensing system 100 may be configured to determine one or more properties 102 of fluid 104 in vessel 106.

Vessel 106 may comprise any appropriate container for containing any appropriate fluid 104. For example, without limitation, vessel 106 may be optically opaque vessel 108 that is magnetically transparent. Magnetically transparent vessel 109 is transparent to magnetic fields.

Fluid 104 may comprise any appropriate fluid. For example, without limitation, fluid 104 may be optically opaque fluid 110 that is magnetically transparent. Magnetically transparent fluid 111 is transparent to magnetic fields.

In accordance with an illustrative embodiment, fluid 104 has magnetic particles 112 therein. For example, without limitation, magnetic particles 112 may be magnetic dipole particles 114.

Magnetic flow sensing system 100 may comprise magnetic field generator 116, magnetic field sensors 118, and computer 120.

Magnetic field generator 116 may be configured to generated applied magnetic field 122 that is applied to fluid 104 in vessel 106. For example, without limitation, magnetic field generator 116 may be implemented using Helmholtz coils 124.

Magnetic field sensors 118 may be configured to detect detected magnetic field 126, wherein detected magnetic field 126 is generated by magnetic particles 112 in fluid 104. For example, without limitation, magnetic field sensors 118 may comprise magnetometers 128 or giant magneto-resistive sensors, GMR. Information regarding detected magnetic field 126 detected by magnetic field sensors 118 may be provided as magnetic field measurements 130 to computer 120.

Computer 120 may be implemented using any appropriate information processing system. Computer 120 may be configured using any appropriate hardware or hardware in combination with software to implement magnetic field generator controller 132, fluid property calculator 134, display generator 136, and display 138.

Fluid property calculator 134 may be configured to determine properties 102 of fluid 104 in vessel 106 from magnetic field measurements 130 provided by magnetic field sensors 118. For example, without limitation, fluid property calculator 134 may comprise one or more of fluid flow calculator 140, fluid temperature calculator 142, and fluid stress and strain calculator 144.

Fluid flow calculator 140 may be configured to determine flow 146 of fluid 104 in vessel 106 from magnetic field measurements 130. For example, without limitation, fluid flow calculator 140 may be configured to determine vorticity 148, velocity 149, or other characteristics of flow 146 of fluid 104 in vessel 106. For example, without limitation, fluid flow calculator 140 may be configured to determine flow 146 of fluid 104 in vessel 106 from magnetic field measurements 130 using fluid field model 154 and particle field model 156.

An example of using fluid field model 154 and particle field model 156 to determine flow 146 of fluid 104 in vessel 106 will now be described in more detail. This particular example is for a fluid between two concentric semi-infinite cylinders, wherein the outer cylinder is fixed and the inner cylinder is spinning. Illustrative embodiments are not limited to the specific example described herein.

Small magnetic tracer particles 112 can be approximated as dipoles with magnetic fields that can be measured at some distance. The following model for the magnetic field of magnetic dipole tracer particles 114 is an example of one implementation of particle field model 156. Start by defining magnetic field sensors i=1, ..., I located at positions $\vec{x}_i^s = (\vec{x}_{ix}^s, \vec{x}_{iy}^s, \vec{x}_{iz}^s)^T$ and an ensemble of permanent magnetic field particles i=1, ..., J located at positions $\vec{x}_j^p = (\vec{x}_{jx}^p, \vec{x}_{jy}^p, \vec{x}_{jz}^p)^T$ with normalized orientations $\vec{m}_j = (\vec{m}_{jx}, \vec{m}_{jy}, \vec{m}_{jz})^T$. The magnetic field from the residual induction of a single particle on a single sensor can be approximated as $$\vec{B}_{ij} = B_j \left( \frac{3(\vec{m}_j \cdot \vec{x}_{ij})}{R_{ij}^5} - \frac{\vec{m}_j}{R_{ij}^3} \right)$$

where $\vec{x}_{ij} = \vec{x}_i^s - \vec{x}_j^p$ is the relative position, $R_{ij} = \|\vec{x}_i^s - \vec{x}_k^p\|$ is the distance. The magnetic field at room temperature is $$B_j \approx \frac{\mu_0}{4\pi} \mu_r M_0 V_j$$

where $M_0$ is the uniform magnetization, $\mu_r$ is the relative permeability, $\mu_0$ is the magnetic vacuum permeability, and $V_j$ is the volume of the magnet. The total contribution of J magnets on sensor i is $\vec{B}_i = \Sigma \vec{B}_{ij} + \vec{C}_i$ where $\vec{C}_i$ are offset constants from fixed external magnetic fields like the magnetic field of the earth.

In a uniformly seeded flow, the number of particles vastly outnumbers the number of sensor readings. Hence, the full volume model can be broken up into sub-volumes over which vorticity can be estimated using a nonlinear least squares formulation $$\min_{\vec{\theta}_B} f(\vec{\theta}_B), \, f(\vec{\theta}_B) = \|\vec{Y} - \vec{B}(\vec{\theta}_B)\|,$$

where $\vec{Y}$ is the offset-compensated magnetic-field measurements. For a uniformly seeded flow, knowledge of the location of any individual particle is not needed but the vorticity or rotation of the flow can estimated. Therefore, the nonlinear least squares formulation searches for the bulk rotation of the particles or $\vec{\theta}_B$ from the ensemble orientations $\vec{m}_j$ of all the particles.

A simple illustration of one possible embodiment of this technique measures the fluid vorticity inside a Taylor-Couette flow. This two-dimensional flow is enclosed by a cylindrical vessel and is driven by a cylindrical rod placed in the center of the vessel. As the rod rotates, it moves the fluid in the vessel due to viscous forces. The equations describing the vorticity and velocity fields can be derived from the Navier-Stokes equations assuming the flow is isentropic, not pressure driven and steady. The equation simplifies to $\nabla^2 v=0$. With no radial or axial velocity, the differential equation can be written as $$\frac{1}{r}\frac{\partial}{\partial r}\left(r\frac{\partial v_\theta}{\partial r}\right) - \frac{v_\theta}{r^2} = 0.$$

For a fixed outer cylinder and spinning inner cylinder with angular velocity $\Omega$, the boundary conditions are $v_\theta(R_2)=0$ and $v_\theta(R_1)=R_1\Omega$ with the radius of the vessel defined as $R_2$ and the radius of the rotating rod defined as $R_1$. Using a solution of the form $$v_\theta = Ar + \frac{B}{r},$$

the angular velocity as a function of radius is $$v_\theta(r) = \frac{\Omega R_1^2}{R_2^2 - R_1^2}\left(\frac{R_2^2}{r} - r\right).$$

The vorticity of the flow is defined as $$\omega = \nabla \times v = \frac{1}{r}\frac{\partial(rv_\theta)}{\partial r} = \frac{-2R_1^2}{R_2^2 - R_1^2}\Omega,$$

which in this case is constant throughout the flow and rotating in the opposite direction with respect to the rotating cylindrical rod.

When using very small spherical particles with respect to the characteristic length of the flow, the rotational rate of the particles is $\omega_p = \omega/2$ corresponding to the shear rate of the flow. The magnetic field measurement produces estimates of the net rotation of the field $\theta_B$ such that $$\frac{d\theta_B}{dt} = \omega_p.$$

Thus, in steady-state, the estimated angular rotation of the magnetic field should be $$\theta_B = \frac{-R_1^2}{R_2^2 - R_1^2}\theta_{R1},$$

where $\theta_{R1}$ is the angle of the inner cylindrical rod. Thus, the measured solution $\theta_B$ can be validated with known rod rotation $\theta_{R1}$ and can also be used to estimate fluid vorticity $\omega$ and fluid velocity $v_\theta(r)$ using the known boundary conditions. The strain rate tensor $\epsilon = \frac{1}{2}(\nabla v + \nabla v^T)$ and viscous stress tensor $\tau = \mu(\nabla v + \nabla v^T)$ can also be calculated for this flow.

Several scaling laws are taken into account to apply this technique. First, the magnetic particles should settle out of the flow due to gravity or buoyancy on timescales slower than the timescale of the measurement. Second, the magnetic particle must have small translation and rotational Stokes numbers in order for the tracer particles to follow the flow. In order to initially align the particles, the magnetic torque of the externally applied field $T_m$ should be stronger than the fluid drag $T_d$ and Brownian motion $T_b$ forces. In order for the magnetic particles to be used as tracer particles after the externally applied field is turned off, the fluid drag must dominate over the residual magnetic torques $T_r$. This produces the following condition $T_m > T_d > T_r > T_b$.

In an exemplary experiment, silicone oils (Dow Corning 200 fluid) and microscopic approximately 5 micrometer Alnico (iron alloy containing aluminum nickel and cobalt) magnetic particles were used. The particles were seeded at a 0.1% by volume into the fluid to minimize disturbances to the flow. The particles were placed in a fluid cell with a diameter of 25.4 mm. An aluminum rod of diameter 6.35 mm was used as the internal rotating rod. The rod was attached to a rotational motor with a bearing structure and a shaft coupling. The motor (Animatics SM23165D) was placed outside two-axis Helmholtz coils (Lakeshore MH-2X-10) that were driven by two amplifiers (Kepco BOP-50-8ML-4886). To avoid saturating the sensors, the Helmholtz coils were driven up to 6 Gauss. Three-axis magnetic field sensors (Honeywell HMC1053) on custom circuit boards were placed close to the sides of the fluid cell. The sensors interfaced with a 16-bit PXI-6255 data acquisition card and a NI-PXIe-1073 chassis. Aluminum and plastic components were used to minimize field steering effects. LabVIEW was used for controlling the Helmholtz coils, implementing calibrations, and acquiring experimental data. MATLAB was used to convert sensor measurements into fluid property estimates.

Fluid temperature calculator 142 may be configured to determine temperature 150 of fluid 104 in vessel 106 from magnetic field measurements 130.

Fluid stress and strain calculator 144 may be configured to determine stress and strain 152 of fluid 104 in vessel 106 from magnetic field measurements 130.

The illustration of material flow sensing system 100 in FIG. 1 is not meant to imply physical or architectural limitations to the manner in which illustrative embodiments may be implemented. Other components, in addition to or in place of the ones illustrated, may be used. Some components may be optional. Also, the blocks are presented to illustrate some functional components. One or more of these blocks may be combined, divided, or combined and divided into different blocks when implemented in an illustrative embodiment.

Figure 2:
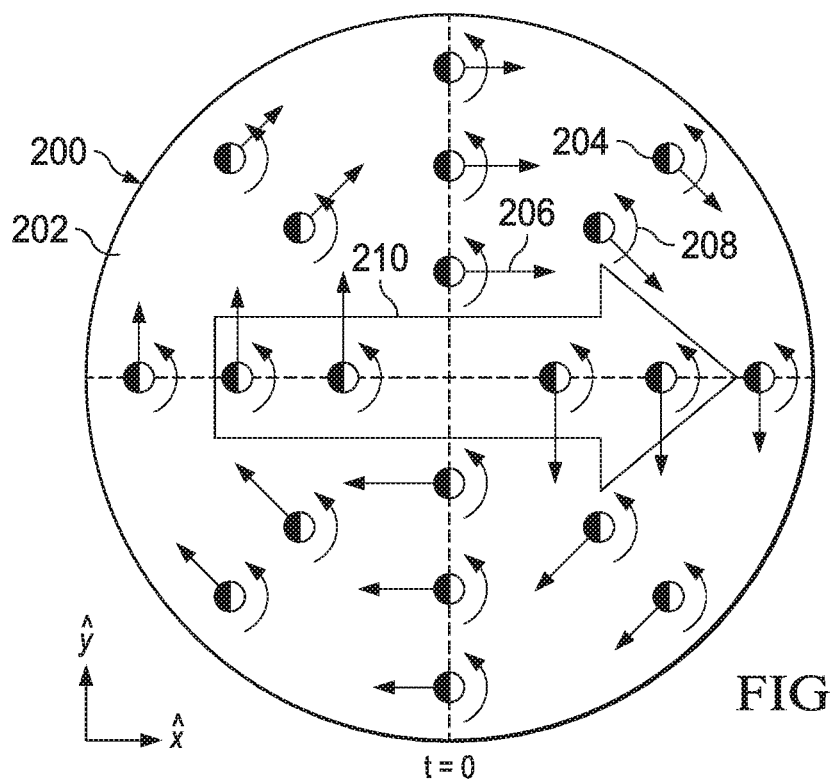
FIG. 2 is an illustration of tracer magnetic particles in a fluid at a time when a magnetic field generator is generating an applied magnetic field in accordance with an illustrative embodiment.

Turing to FIG. 2, an illustration of tracer magnetic particles in a fluid at a time when a magnetic field generator is generating an applied magnetic field is depicted in accordance with an illustrative embodiment. Vessel 200 containing fluid 202 may be an example of a cross-section of one implementation of vessel 106 containing fluid 104 in FIG. 1.

Magnetic dipole particles are distributed in fluid 202 and are moved by the movement of fluid 202 in vessel 200. For example, magnetic dipole particle 204 is moved in fluid 202 along a velocity vector indicated by arrow 206 and is rotated in the direction of arrow 208 by local vorticity in fluid 202.

A magnetic field in the direction indicated by arrow 210 is applied to vessel 200. As shown, the applied magnetic field aligns the magnetic dipole particles in fluid 202 to the same orientation in the x direction. At time t=0, the application of the applied magnetic field to vessel 200 is stopped.

Figure 3:
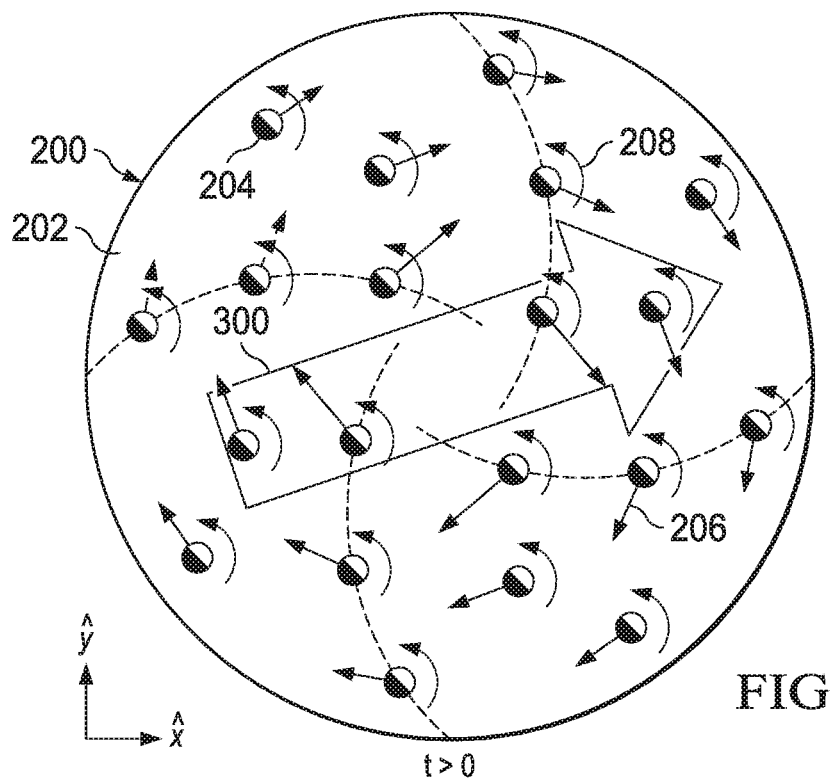
FIG. 3 is an illustration of tracer magnetic particles in a fluid at a time after the magnetic field generator has stopped generating an applied magnetic field and the tracer magnetic particles have moved due to fluid properties in accordance with an illustrative embodiment.

Turning to FIG. 3, an illustration of tracer magnetic particles in a fluid at a time after the magnetic field generator has stopped generating an applied magnetic field and the tracer magnetic particles have moved due to fluid properties is depicted in accordance with an illustrative embodiment. FIG. 3 shows vessel 200 containing fluid 202 of FIG. 2 at a time t>0.

As shown, at a time t>0 the magnetic dipole particles have moved in position and rotated due to flow of fluid 202 in vessel. At this time, the magnetic dipole particles produce a bulk magnetic field in the direction of arrow 300. As described herein, in accordance with an illustrative embodiment, the magnetic field generated by the magnetic dipole particles at time t>0 may be detected from outside of vessel 200 and used to determine properties of fluid 202 in vessel 200, such as vorticity, velocity, stress and strain.

Figure 4:
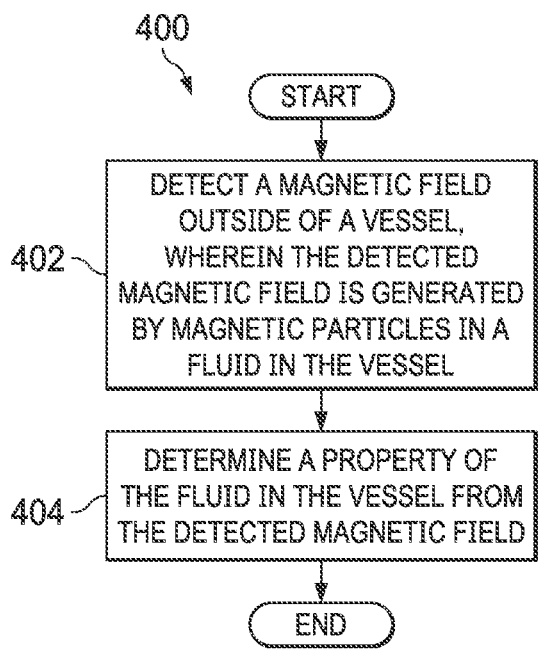
FIG. 4 is an illustration of a flowchart of a process for determining a property of a fluid in a vessel in accordance with an illustrative embodiment.

Turning to FIG. 4, an illustration of a flowchart of a process for determining a property of a fluid in a vessel is depicted in accordance with an illustrative embodiment. Process 400 may be implemented in material flow sensing system 100 in FIG. 1.

Process 400 may begin with detecting a magnetic field outside of a vessel, wherein the detected magnetic field is generated by magnetic particles in a fluid in the vessel (operation 402). A property of the fluid in the vessel may then be determined from the detected magnetic field (operation 406), with the process terminating or repeating thereafter.

Figure 5:
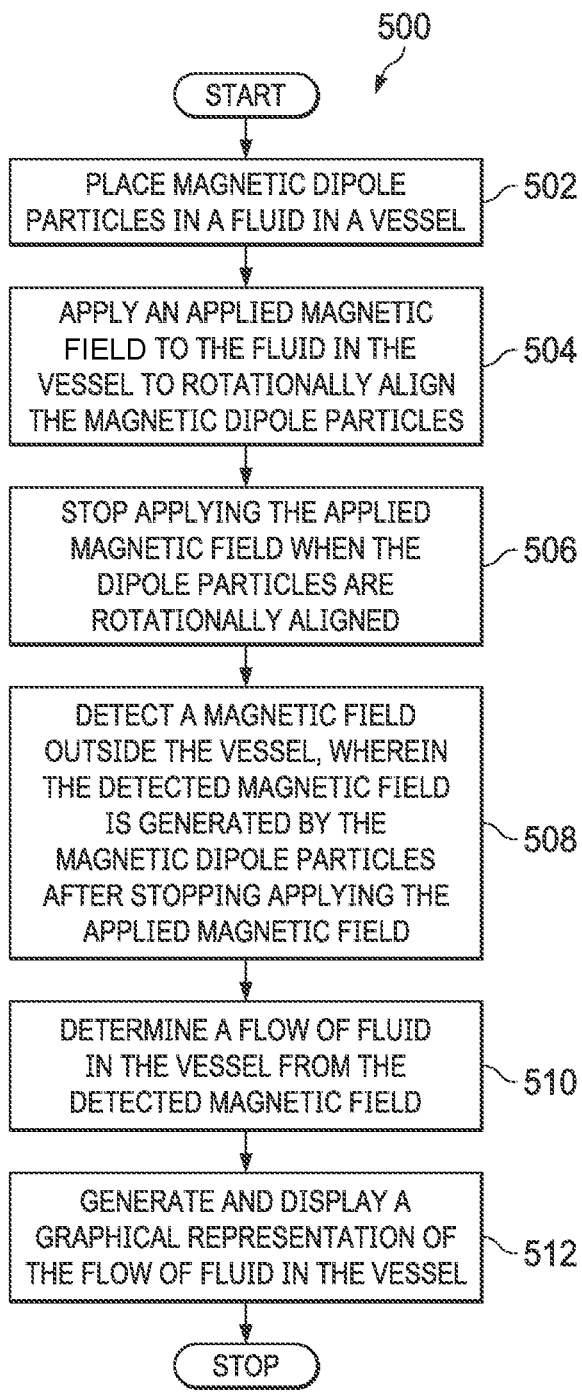
FIG. 5 is an illustration of a flowchart of a process for determining a flow of fluid in a vessel in accordance with an illustrative embodiment.

Turning to FIG. 5, an illustration of a flowchart of a process for determining a flow of fluid in a vessel is depicted in accordance with an illustrative embodiment. Process 500 may be implemented in material flow sensing system 100 in FIG. 1. Process 500 may be a more specific example of process 400 in FIG. 4.

Process 500 may begin with placing magnetic dipole particles in a fluid in a vessel (operation 502). An applied magnetic field may then be applied to the fluid in the vessel to rotationally align the magnetic dipole particles (operation 504). Applying of the applied magnetic field may be stopped when the magnetic dipole particles are rotationally aligned (operation 506). A detected magnetic field may then be detected outside the vessel, wherein the detected magnetic field is generated by the magnetic dipole particles after applying the applied magnetic field is stopped (operation 508). A flow of fluid in the vessel may then be determined from the detected magnetic field (operation 510). A graphical representation of the flow of fluid in the vessel may then be generated and displayed (operation 512), with the process terminating or repeating from operation 504 thereafter.

Figure 6:
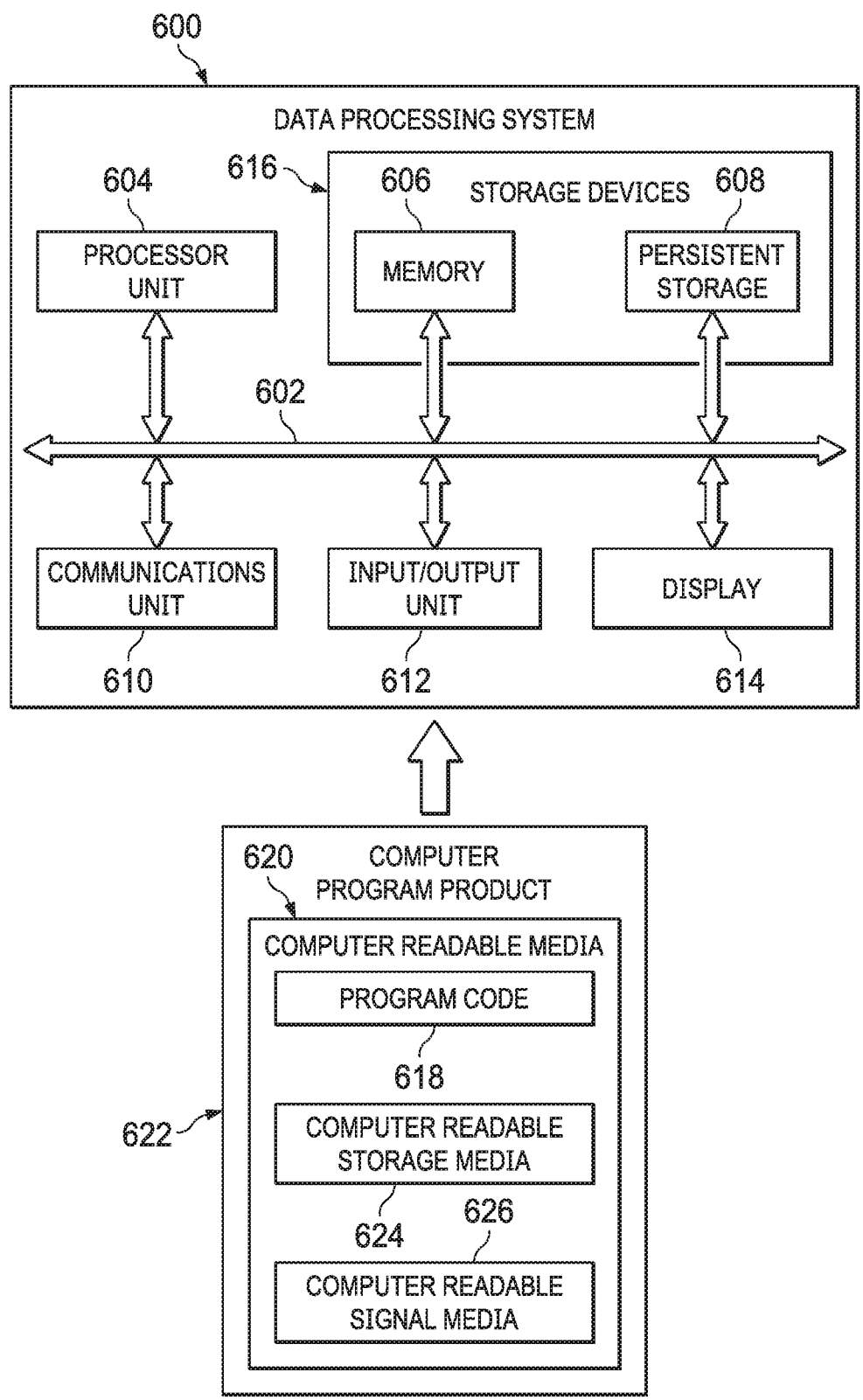
FIG. 6 is an illustration of a block diagram of a data processing system in accordance with an illustrative embodiment.

Turning to FIG. 6, an illustration of a block diagram of a data processing system is depicted in accordance with an illustrative embodiment. Data processing system 600 is an example of one possible implementation of computer 120 in material flow sensing system 100 in FIG. 1.

In this illustrative example, data processing system 600 includes communications fabric 602.

Communications fabric 602 provides communications between processor unit 604, memory 606, persistent storage 608, communications unit 610, input/output (I/O) unit 612, and display 614. Memory 606, persistent storage 608, communications unit 610, input/output (I/O) unit 612, and display 614 are examples of resources accessible by processor unit 604 via communications fabric 602.

Processor unit 604 serves to run instructions for software that may be loaded into memory 606. Processor unit 604 may be a number of processors, a multi-processor core, or some other type of processor, depending on the particular implementation. Further, processor unit 604 may be implemented using a number of heterogeneous processor systems in which a main processor is present with secondary processors on a single chip. As another illustrative example, processor unit 604 may be a symmetric multi-processor system containing multiple processors of the same type.

Memory 606 and persistent storage 608 are examples of storage devices 616. A storage device is any piece of hardware that is capable of storing information, such as, for example, without limitation, data, program code in functional form, and other suitable information either on a temporary basis or a permanent basis. Storage devices 616 also may be referred to as computer readable storage devices in these examples. Memory 606, in these examples, may be, for example, a random access memory or any other suitable volatile or non-volatile storage device. Persistent storage 608 may take various forms, depending on the particular implementation.

For example, persistent storage 608 may contain one or more components or devices. For example, persistent storage 608 may be a hard drive, a flash memory, a rewritable optical disk, a rewritable magnetic tape, or some combination of the above. The media used by persistent storage 608 also may be removable. For example, a removable hard drive may be used for persistent storage 608.

Communications unit 610, in these examples, provides for communications with other data processing systems or devices. In these examples, communications unit 610 is a network interface card. Communications unit 610 may provide communications through the use of either or both physical and wireless communications links.

Input/output (I/O) unit 612 allows for input and output of data with other devices that may be connected to data processing system 600. For example, input/output (I/O) unit 612 may provide a connection for user input through a keyboard, a mouse, and/or some other suitable input device. Further, input/output (I/O) unit 612 may send output to a printer. Display 614 provides a mechanism to display information to a user.

Instructions for the operating system, applications, and/or programs may be located in storage devices 616, which are in communication with processor unit 604 through communications fabric 602. In these illustrative examples, the instructions are in a functional form on persistent storage 608. These instructions may be loaded into memory 606 for execution by processor unit 604. The processes of the different embodiments may be performed by processor unit 604 using computer-implemented instructions, which may be located in a memory, such as memory 606.

These instructions are referred to as program instructions, program code, computer usable program code, or computer readable program code that may be read and executed by a processor in processor unit 604. The program code in the different embodiments may be embodied on different physical or computer readable storage media, such as memory 606 or persistent storage 608.

Program code 618 is located in a functional form on computer readable media 620 that is selectively removable and may be loaded onto or transferred to data processing system 600 for execution by processor unit 604. Program code 618 and computer readable media 620 form computer program product 622 in these examples. In one example, computer readable media 620 may be computer readable storage media 624 or computer readable signal media 626.

Computer readable storage media 624 may include, for example, an optical or magnetic disk that is inserted or placed into a drive or other device that is part of persistent storage 608 for transfer onto a storage device, such as a hard drive, that is part of persistent storage 608. Computer readable storage media 624 also may take the form of a persistent storage, such as a hard drive, a thumb drive, or a flash memory, that is connected to data processing system 600. In some instances, computer readable storage media 624 may not be removable from data processing system 600.

In these examples, computer readable storage media 624 is a physical or tangible storage device used to store program code 618 rather than a medium that propagates or transmits program code 618. Computer readable storage media 624 is also referred to as a computer readable tangible storage device or a computer readable physical storage device. In other words, computer readable storage media 624 is a media that can be touched by a person.

Alternatively, program code 618 may be transferred to data processing system 600 using computer readable signal media 626. Computer readable signal media 626 may be, for example, a propagated data signal containing program code 618. For example, computer readable signal media 626 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 618 may be downloaded over a network to persistent storage 608 from another device or data processing system through computer readable signal media 626 for use within data processing system 600. For instance, program code stored in a computer readable storage medium in a server data processing system may be downloaded over a network from the server to data processing system 600. The data processing system providing program code 618 may be a server computer, a client computer, or some other device capable of storing and transmitting program code 618.

The different components illustrated for data processing system 600 are not meant to provide architectural limitations to the manner in which different embodiments may be implemented. The different illustrative embodiments may be implemented in a data processing system including components in addition to and/or in place of those illustrated for data processing system 600. Other components shown in FIG. 6 can be varied from the illustrative examples shown. The different embodiments may be implemented using any hardware device or system capable of running program code. As one example, data processing system 600 may include organic components integrated with inorganic components and/or may be comprised entirely of organic components excluding a human being. For example, a storage device may be comprised of an organic semiconductor.

In another illustrative example, processor unit 604 may take the form of a hardware unit that has circuits that are manufactured or configured for a particular use. This type of hardware may perform operations without needing program code to be loaded into a memory from a storage device to be configured to perform the operations.

For example, when processor unit 604 takes the form of a hardware unit, processor unit 604 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 618 may be omitted, because the processes for the different embodiments are implemented in a hardware unit.

In still another illustrative example, processor unit 604 may be implemented using a combination of processors found in computers and hardware units. Processor unit 604 may have a number of hardware units and a number of processors that are configured to run program code 618. With this depicted example, some of the processes may be implemented in the number of hardware units, while other processes may be implemented in the number of processors.

In another example, a bus system may be used to implement communications fabric 602 and may be comprised of one or more buses, such as a system bus or an input/output bus. Of course, the bus system may be implemented using any suitable type of architecture that provides for a transfer of data between different components or devices attached to the bus system.

Additionally, communications unit 610 may include a number of devices that transmit data, receive data, or both transmit and receive data. Communications unit 610 may be, for example, a modem or a network adapter, two network adapters, or some combination thereof. Further, a memory may be, for example, memory 606, or a cache, such as that found in an interface and memory controller hub that may be present in communications fabric 602.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the figures. For example, the functions of two blocks shown in succession may be executed substantially concurrently, or the functions of the blocks may sometimes be executed in the reverse order, depending upon the functionality involved.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of determining a property of a fluid in a vessel, comprising:
   applying a first magnetic field to the fluid in the vessel from outside of the vessel to rotationally align magnetic dipole particles in the fluid;
   stopping applying the first magnetic field to the fluid in the vessel when the magnetic dipole particles in the fluid are rotationally aligned;
   after stopping applying the first magnetic field, detecting a second magnetic field from outside of the vessel, wherein the second magnetic field is generated by the magnetic dipole particles in the fluid; and
   determining the property of the fluid in the vessel from the second magnetic field.

2. The method of claim 1, wherein determining the property of the fluid in the vessel comprises determining a vorticity or a velocity of flow of the fluid in the vessel.

3. The method of claim 1, wherein determining the property of the fluid in the vessel comprises determining a temperature of the fluid in the vessel.

4. The method of claim 1, wherein determining the property of the fluid in the vessel comprises determining a state of stress or strain of the fluid in the vessel.

5. The method of claim 1, wherein the fluid is optically opaque and magnetically transparent.

6. The method of claim 1, wherein the vessel is optically opaque and magnetically transparent.

7. The method of claim 1, further comprising placing the magnetic dipole particles in the fluid in the vessel.

8. A method of determining a property of a fluid in a vessel, comprising:
   applying a first magnetic field to the fluid in the vessel from outside of the vessel to rotationally align magnetic dipole particles in the fluid;
   stopping applying the first magnetic field to the fluid in the vessel when the magnetic dipole particles in the fluid are rotationally aligned;
   after stopping applying the first magnetic field, detecting a second magnetic field outside of the vessel, wherein the second magnetic field is generated by the magnetic dipole particles in the fluid;
   determining a flow of fluid in the vessel from the second magnetic field; and
   displaying a graphical representation of the flow of fluid in the vessel.

9. The method of claim 8, wherein the vessel is optically opaque and magnetically transparent.

10. The method of claim 8, wherein applying the first magnetic field comprises applying the first magnetic field using a Helmholtz coil.

11. The method of claim 8, wherein detecting the second magnetic field comprises detecting the second magnetic field using magnetometers or giant magneto-resistive sensors.

12. The method of claim 8, wherein determining the flow of fluid in the vessel comprises inverting magnetic field measurements of the second magnetic field using a particle field model to determine movement of the magnetic dipole particles in the vessel.

13. The method of claim 8, wherein displaying the graphical representation of the flow of fluid in the vessel comprises displaying a three-dimensional time-varying map of paths of movement of the magnetic dipole particles.

14. The method of claim 8 further comprising placing the magnetic dipole particles in the fluid in the vessel.

15. An apparatus, comprising:
   a magnetic field generator;
   a magnetic field generator controller configured to control the magnetic field generator to apply a first magnetic field to a fluid in a vessel from outside of the vessel to rotationally align magnetic dipole particles in the fluid and to stop applying the first magnetic field to the fluid in the vessel when the magnetic dipole particles in the fluid are rotationally aligned;
   a magnetic field sensor configured to detect a second magnetic field outside of the vessel, wherein the second magnetic field is generated by the magnetic dipole particles in the fluid after applying the first magnetic field to the fluid in the vessel is stopped;
   a fluid flow calculator configured to determine a flow of the fluid in the vessel from the second magnetic field; and
   a display generator configured to generate a graphical representation of the flow of fluid in the vessel.

16. The apparatus of claim 15, wherein the vessel is optically opaque and magnetically transparent.

17. The apparatus of claim 15, wherein the magnetic field generator comprises a Helmholtz coil.

18. The apparatus of claim 15, wherein the magnetic field sensor comprises giant magneto-resistive sensors or magnetometers.

19. The apparatus of claim 15, wherein the fluid flow calculator is configured to determine the flow of fluid in the vessel by inverting magnetic field measurements of the second magnetic field using a particle field model to determine movement of the magnetic dipole particles in the vessel.

20. The apparatus of claim 15, wherein the display generator is configured to generate the graphical representation of the flow of fluid in the vessel comprising a three-dimensional time-varying map of paths of movement of the magnetic dipole particles.

* * * * *